(12) United States Patent
Treu et al.

(10) Patent No.: US 7,772,621 B2
(45) Date of Patent: Aug. 10, 2010

(54) SEMICONDUCTOR DEVICE WITH STRUCTURED CURRENT SPREAD REGION AND METHOD

(75) Inventors: Michael Treu, Villach (AT); Roland Rupp, Lauf (DE); Rudolf Elpelt, Erlangen (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 11/858,264

(22) Filed: Sep. 20, 2007

(65) Prior Publication Data

US 2009/0078971 A1 Mar. 26, 2009

(51) Int. Cl.
*H01L 29/78* (2006.01)
(52) U.S. Cl. .................. 257/263; 257/269; 257/329; 257/E29.313; 257/E29.257
(58) Field of Classification Search ................ 257/263, 257/269, 329, E29.257, E29.313
See application file for complete search history.

(56) References Cited

U.S. PATENT DOCUMENTS 3,959,808 A 5/1976 King

| 5,656,843 A * | 8/1997 | Goodyear et al. ........... 257/329 |
| 2005/0062112 A1* | 3/2005 | Dohnke et al. .............. 257/409 |
| 2008/0157117 A1* | 7/2008 | McNutt et al. .............. 257/133 |
| 2009/0146154 A1* | 6/2009 | Zhang et al. ................. 257/77 |

FOREIGN PATENT DOCUMENTS

DE 10350160 * 6/2005 ............. 29/80

* cited by examiner

*Primary Examiner*—Victor A Mandala
(74) *Attorney, Agent, or Firm*—Dicke, Billig & Czaja, PLLC (57) ABSTRACT

A semiconductor device with structured current spread region and method is disclosed. One embodiment provides a drift portion of a first conductivity type, a current spread portion of the first conductivity type and first portions of the first conductivity type. The current spread portion and the first portions are arranged in a first plane on the drift portion, wherein the current spread portion surrounds at least partially the first portions. The semiconductor body further includes spaced apart body regions of a second conductivity type which are arranged on the current spread portion. Further, the doping concentration of the current spread portion is higher than the doping concentrations of the drift portion and of the first portions.

20 Claims, 5 Drawing Sheets

SEMICONDUCTOR DEVICE WITH STRUCTURED CURRENT SPREAD REGION AND METHOD

BACKGROUND

Electronically-controlled switching devices such as a Metal Oxide Semiconductor Field Effect Transistors (MOSFET) or a Junction Field Effect Transistors (JFET) have been used for various applications.

Particularly with regard to but not limited to power devices, capable of switching large currents, a low resistance in the conducting on-state and a high breakdown voltage in the off-state are desired. This is to minimize losses in the on-state and to avoid possible damage in the off-state at higher voltages that may occur during operation of the device.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

The term "lateral" as used in this specification intends to describe an orientation parallel to a first surface of a semiconductor substrate or body. This can be for instance the surface of a wafer or a die. The first plane extends substantially parallel to the first surface and thus in a lateral direction.

The term "vertical" as used in this specification intends to describe an orientation which is arranged perpendicular to the first surface and the first plane of the semiconductor substrate or body.

Specific embodiments described in this specification pertain to voltage-controlled semiconductor resistances and to switching semiconductor devices, in one embodiment to field-effect controlled power semiconductor devices such as vertical JFETs and vertical MOSFETs.

Herein described is a semiconductor device, in one embodiment a power switching device, including a structured current spread portion and a manufacturing method therefor. According to one embodiment, a semiconductor device is provided. The semiconductor device includes a drift portion of a first conductivity type, a current spread portion of the first conductivity type and first portions of the first conductivity type. The current spread portion and the first portions, which are at least partially surrounded by the current spread portion, are arranged in a first plane on the drift portion. The semiconductor body further includes spaced apart body regions of a second conductivity type which are arranged on the current spread portion. Further, the doping concentration of the current spread portion is higher than the doping concentrations of the drift portion and of the first portions.

Due to the higher conductivity of the current spread portion, the current can be broader spread in the drift portion, thereby decreasing the on-state resistance of the device. In the off-state the first portions of the drift region reduce the electric field strength in certain areas of the semiconductor body near the body regions, thereby increasing the break-down voltage of the device.

Figure 1:
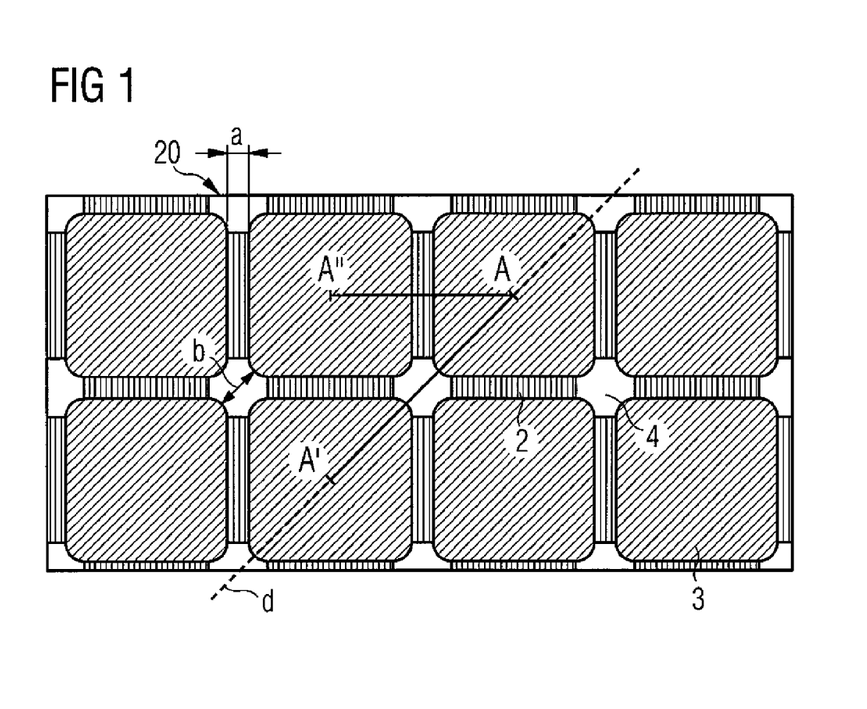
FIG. 1 illustrates a plan view on an arrangement of a semiconductor device according to an embodiment.
Figure 2A:
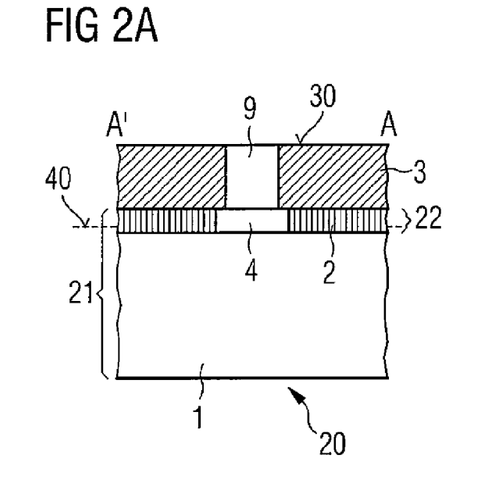
FIG. 2A illustrates a vertical cross-section of the semiconductor device according to FIG. 1.
Figure 2B:
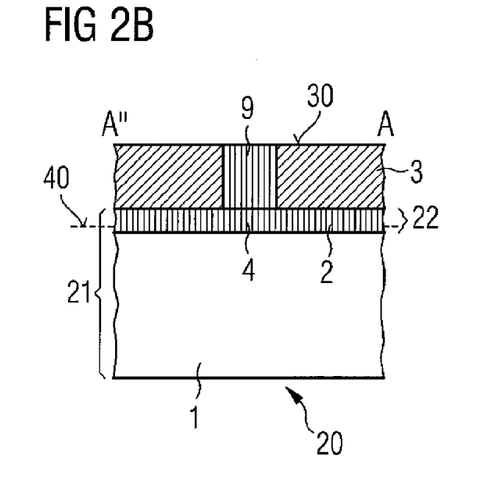
FIG. 2B illustrates another vertical cross-section of the semiconductor device according to FIG. 1.

FIG. 1 illustrates one embodiment of a semiconductor device in a plan view or projection on a first plane 40 which runs substantially parallel to a first surface 30 of a semiconductor substrate or body 20 as illustrated in FIGS. 2A and 2B. In a vertical cross-section the semiconductor device of FIG. 1 can be structured as presented in FIG. 2A. In particular, FIG. 2A illustrates a section of the semiconductor device in a plane d between A' and A as depicted in FIG. 1. The plane d runs substantially perpendicular to the first surface 30 and the first plane 40 of the semiconductor body 20.

The semiconductor substrate or body 20 can be for instance a wafer or a die. The semiconductor device includes the semiconductor body 20, which can for example be comprised of silicon carbide (SiC). The material of the semiconductor body is, however, not limited to SiC and can also include Si or GaN.

The semiconductor body 20 includes a first semiconductor region 1 of a first conductivity type including a first doping concentration. Typically, the first semiconductor region 1 forms a drift portion 1 of a drift region 21. In the following description, the term "drift portion" is used and includes the term "first semiconductor region". This should, however, not be considered as a limitation. Typically the drift portion 1 can have a first doping concentration of about $1*10^{15}/cm^3$ to about some $10^{16}/cm^3$ particularly in case of SiC.

On the drift portion 1 a second semiconductor region 22 of the first conductivity type is arranged in the first plane 40 which extends substantially parallel to the first surface 30 of the semiconductor body 20.

The term "arranged in a plane" intends to describe that the respective semiconductor regions or portions are intersected by the plane. If a semiconductor region or portion includes more than one sub-region, the term "arranged in a plane" intends to describe that all sub-regions are intersected by the plane. Typically, the second semiconductor region or portion 22 includes a significantly smaller extension in a vertical direction and is substantially orientated parallel to the first plane 40. Further, the second semiconductor region or portion 22 is typically flat and has a layer-like arrangement.

The second semiconductor region 22 is typically in contact with the drift portion 1 and forms, as a part of the drift region 21, a structured current spread region or portion 22. In the following description, the term "structured current spread region" is used and includes the term "second semiconductor region". This should, however, not be considered as a limitation.

The structured current spread region 22 includes at least a first portion 4 having a third doping concentration and at least a second portion 2 having a second doping concentration which is higher than the third doping concentration. The first portion 4 and the second portion 2 are typically arranged in the first plane 40. Further, the first portion 4 and second portion 2 are of the first conductivity type. Typically, they are part of the drift region 21, whereas the second portion 2 forms a current spread portion 2. In the following description, the term "current spread portion" is used and includes the term "second portion". This should, however, not be considered as a limitation. In other words, the semiconductor device includes a drift region 21 which includes the drift portion 1 and the structured current spread region 22. The structured current spread region 22 is arranged in the first plane 40 on the drift portion 1 and includes first portions 4 and the current spread portion 2. The current spread portion 2 includes the second doping concentration which is higher than the doping concentration of the drift portion 1. The second doping concentration typically ranges from about $1*10^{16}/cm^3$ to about $1*10^{17}/cm^3$ particularly in case of SiC.

In one or more embodiments, referring to power semiconductor devices, the structured current spread region 22 includes several or a plurality of first portions 4.

Typically, the doping concentration of the drift portion 1 and of the first portions 4 are substantially equal. The first portions 4 are regions of the drift region 21, which are for example not doped during formation of the current spread portions 2 as becomes apparent from the description below. This simplifies manufacturing process and, therefore, reduces overall production time and costs.

According to one or more embodiments, the first portions 4 are partially surrounded by the current spread portion 2. In a projection on the first plane 40 they are typically completely surrounded by the current spread portion 2. The first portions 4 are usually in contact with the drift portion 1. Therefore the first portions 4 are only partially surrounded by the current spread portion 2 in a vertical cross-section.

Usually, the lateral extension of the current spread portion 2 is larger then its vertical extension. The vertical thickness of the current spread portion 2 ranges typically from about 0.5 µm to about 1.0 µm for SiC. A typical blocking voltage ranges of those devices ranges from about 600V to about 1200V. In other words, the current spread portion 2 can be formed as a current spread layer. In this case, the structured current spread region 22 is formed as a structured or composite current spread layer 22.

The semiconductor body 20 further includes at least a third semiconductor region 3 of a second conductivity type which is arranged on the current spread portion 2 on a side opposite to the drift portion 1. In one or more embodiments, the first and second conductivity types correspond to n dopant type and p dopant type, respectively. It will be appreciated by those skilled in the art that the doping can be reversed. The doping concentration of the third semiconductor regions ranges typically from about $1*10^{18}/cm^3$ to about $1*10^{20}/cm^3$.

The third semiconductor region 3 can form a body region 3. In the following description, the term "body region" is used and includes the term "third semiconductor region". This should, however, not be considered as a limitation.

In one or more embodiments, referring to power semiconductor devices, the semiconductor body 20 includes several or a plurality of body regions 3 which are spaced apart from each other, thereby forming several or a plurality of semiconductor cells.

Usually, the body regions 3 are in contact with the current spread portion 2. Body regions 3 are arranged on current spread portion 2 on a side opposite to drift portion 1. Further, the body regions 3 can be isolated form each other by spacer portions 9 of the first conductivity type. The spacer portions 9 can at least partially belong to the drift region 21. As such their doping concentrations can be substantially equal to the first doping concentration.

The first portion 4 and the spacer portion 9 can further be designed such that they have substantially the same lateral extension in at least a first cross-section perpendicular to the first plane 40. The first portion 4 and the spacer portion 9 can be designed such, that the first portion 4 has a larger lateral extension than the spacer portion 9, in the first cross-section (perpendicular to the first plane 40). In this case, body portions 3 partially overlaps, in the cross-section, the first portions 4 which provides even better improvement of the electrical field distribution on critical corner or edge regions of the body regions as it becomes more apparent from the description below (see FIG. 2A).

In another cross-section (A"-A in FIG. 1), which is perpendicular to the first plane 40 but not parallel to the first cross-section, the current spread region 22 is not structured and hence, no first portions 4 exist. Cross-section A"-A is illustrated in FIG. 2B. In fact, the current spread portion 22 extends into the spacer portion 9 so that the spacer portions 9 will have substantially the same doping concentration as the current spread portion 2. Typically, the spacer regions 9 between portions of adjacent body regions, which run substantially parallel to each other, have the same doping concentration as the current spread portion 2. By increasing the doping concentration in those spacer regions 9, parasitic JFETs between adjacent body regions 3 can be prevented. Further, the on-state resistance of the device can be improved.

PN-junctions are typically formed between the body region 3 and the adjoining regions, especially between the body region 3 and the current spread portion 2 and the spacer portion 9, respectively.

In operating the semiconductor device, a current path is at least partially formed within the drift region 21 to provide a substantially vertical current flow. The resistance of the device can be adjusted by controlling the extension of a depletion region at certain pn-junctions. In order to minimize the Ohmic losses in the low resistance on-state the current is spread in the drift portion 1 by the current spread portion 2.

Therefore, the doping concentration of the current spread portion 2 typically exceeds the first doping concentration by a factor of about 2 to about 20.

In one embodiment, a power semiconductor device, several or a plurality of substantially identical semiconductor cells are switched in parallel, thereby increasing the switchable current. For this purpose the body regions 3 can, in a lateral direction, be evenly distributed or lattice-like arranged in the semiconductor body 20. The embodiment illustrated in FIG. 1 and 3 pertain to arrangements of the body regions 3 on a lateral square lattice and on a lateral triangular or hexagonal lattice, respectively. In further embodiments, the body regions 3 can be arranged on a one-dimensional lattice or a lattice of rhombic or rectangular or hexagonal symmetry or on any other regular lateral lattice. FIGS. 2A and 2B can pertain to any of the embodiments having lattice like arranged body regions 3, in particular to arrangements of the body regions 3 on a lateral triangular, hexagonal or square lattice. Further, FIGS. 2A and 2B can pertain to embodiments of semiconductor devices having a few or even only two cells.

In one or more embodiments a respective first portion 4 is arranged, in a plan view from a direction normal to the first plane 40, at least between adjacent body regions 3 in an area defined by at least three adjacent body regions 3. This means, that, in the plan view, the contour or outline of the first portion 4 lies completely within an area spanned by the centres of the at least three adjacent body regions 3. An example corresponding to three adjacent body regions 3 is given in FIG. 3. In case of four adjacent body regions, as for instance illustrated in FIGS. 1 and 4, the contour or outline of respective first portions 4 lies completely within an area spanned by the centres of four adjacent body regions 3.

In other words, the semiconductor body 20 of the semiconductor device includes the first semiconductor region 1 of the first conductivity type and the second semiconductor region 22 of the first conductivity type which is arranged in the first plane 40 on the first semiconductor region 1. The second semiconductor region includes several or a plurality of first portions 4 of the first doping concentration and at least one second portion 2 of the second doping concentration which is higher then the first doping concentration. The semiconductor body 20 further includes several or a plurality of third semiconductor regions 3 of the second conductivity type which are arranged on the second portion 2 of the second semiconductor region 22. Further, a respective first portion 4 is arranged at least between adjacent third semiconductor regions 3 in an area defined by at least two or three, and particularly by at least four adjacent third semiconductor regions 3. The location, where the first portions 4 are arrange, depends on the layout of the body regions. For example, when considering a stripe layer, first portions are arranged between adjacent strips at their ends, since there the stripes have corners or at least curved regions. In a hexagonal layout as illustrated in FIG. 3 the first portions are arranged between three adjacent body regions 3 while the first portions 4 are arranged between four adjacent body regions in case of the square layout of FIG. 1.

In a plan view from a direction normal to the first plane 40, the outline of the first portion 4 can touch or cross the outline of at least one of the at least two or three adjacent body regions 3 or can lie completely between the outlines of the at least two or three adjacent or neighbouring body regions 3. Typically, the shape and the position of the outline of the portions 4 is chosen such, that the average distance and/or overlap with each of the at least three neighbouring body regions 3 is substantially equal in the plane view. This ensures a uniform current and load distribution between the individual current paths and cells. Further, the first portions 4 are usually simply connected in a mathematical sense.

In the embodiment illustrated in FIG. 1 a respective portion 4 is located, in a plan view from a direction normal to the first plane 40, between four directly neighbouring body regions 3 adjoining the respective first portion 4. Different thereto, FIG. 3 illustrates an embodiment in which, in the plane view, the area of the respective first portion 4 is bounded by the three corner regions of the body regions 3 next to each other on the lateral hexagonal or triangular lattice.

Figure 3:
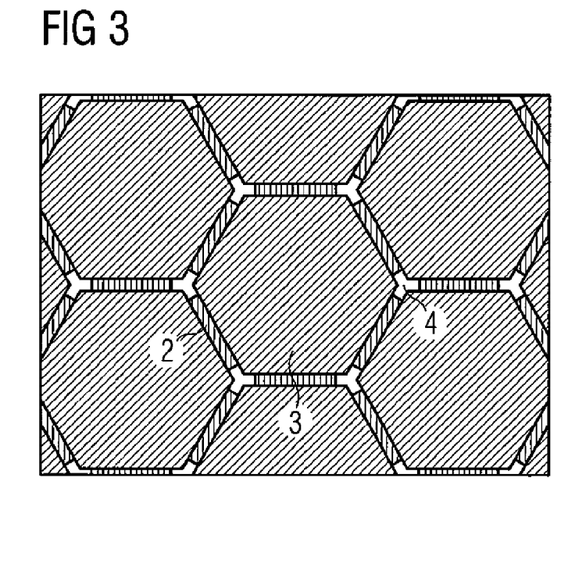
FIG. 3 illustrates a plan view on an arrangement of a semiconductor device according to another embodiment.

In the plan view from a direction normal to the first plane 40 of the embodiments illustrated in FIG. 1 and 3, a respective first portion 4 is centrally arranged between and adjoins the adjacent body regions 3. Further, the first portions 4 are lattice-like arranged related to the arrangement of the body regions 3. Typically, the first portions 4 are arranged on a lattice which is displaced with respect to the lattice of the body regions 3. In other words, the first portions 4 can be placed, in the plane view, interstitial between the body regions 3. Typically, a regular lattice is formed by the centre positions of the body regions 3 and first portions 4. This ensures a uniformly distributed load between the plurality of cells of the power semiconductor device.

In a one or more embodiment the first portions 4 are arranged at least in an area where, in a projection on the first plane 40, the contour of the body region 3 is at least partially curved.

In other words, the semiconductor body 20 of the semiconductor device includes the first semiconductor region 1 of the first conductivity type and the second semiconductor region 22 of the first conductivity type which is arranged in the first plane 40 on the first semiconductor region 1. The second semiconductor region includes at least one first portion 4 of the first doping concentration and at least one second portion 2 of the second doping concentration which is higher then the first doping concentration. The semiconductor body 20 further includes at least one third semiconductor regions 3 of the second conductivity type which is arranged on the second portion 2 of the second semiconductor region 22. Further, the third semiconductor region 3 has, in the plan view from a direction normal to the first plane 40, a curved contour at least in the proximity to the first portion 4.

The term "curved" related to an outline or contour as used in this description intends to describe points of an outline or contour including a finite curvature or being a corner. In other words, an outline or contour is considered to be curved in any point in which the outline or contour deviates from a straight line. Accordingly, FIG. 1 and 3 correspond to embodiments in which the first portions 4 are placed, in the projection on the first plane 40, in areas proximate and adjoining the areas where the outline of the body regions 3 have a finite curvature and a corner, respectively.

Further, the first portions 4 can cover or overlap, in the plan view from a direction normal to the first plane, areas where the third semiconductor regions include a curved contour.

Figure 4:
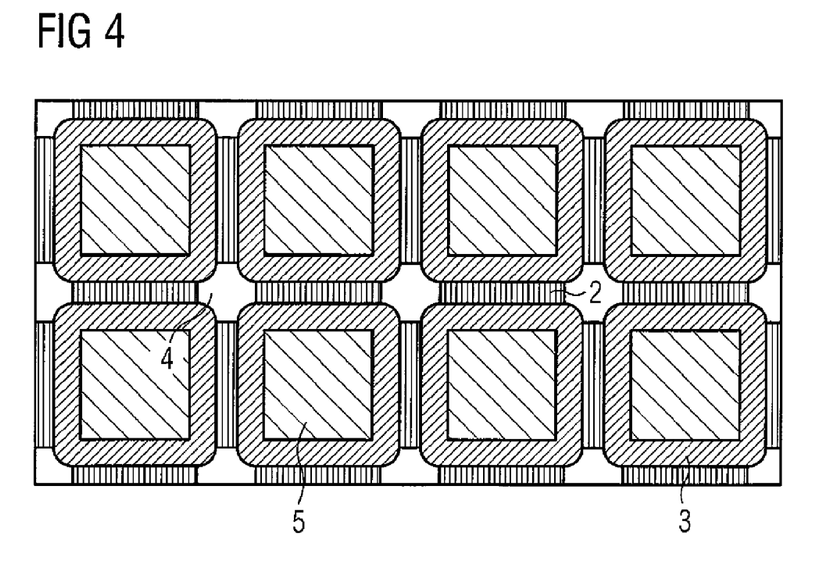
FIG. 4 illustrates a plan view on an arrangement of a semiconductor device according to another embodiment.

With respect to FIG. 4, another embodiment will be described. In addition to the embodiments illustrated in FIGS. 1 to 3 a fifth semiconductor region 5 of the first conductivity type is arranged on each of the body regions 3. Typically, the fifth semiconductor region 5 forms a source region. Therefore, it has a higher doping concentration than a channel region 10 as explained below. In the following description, the term "source region" is used and includes the term "fifth semiconductor region". This should, however, not be considered as a limitation. The doping concentration of the source region 5 typically ranges from about $1*10^{19}/cm^3$ to about $1*10^{20}/cm^3$.

In one or more embodiments the source region 5 is, in the plan view from a direction normal to the first plane 40, enclosed by the body region 3.

Figure 5A:
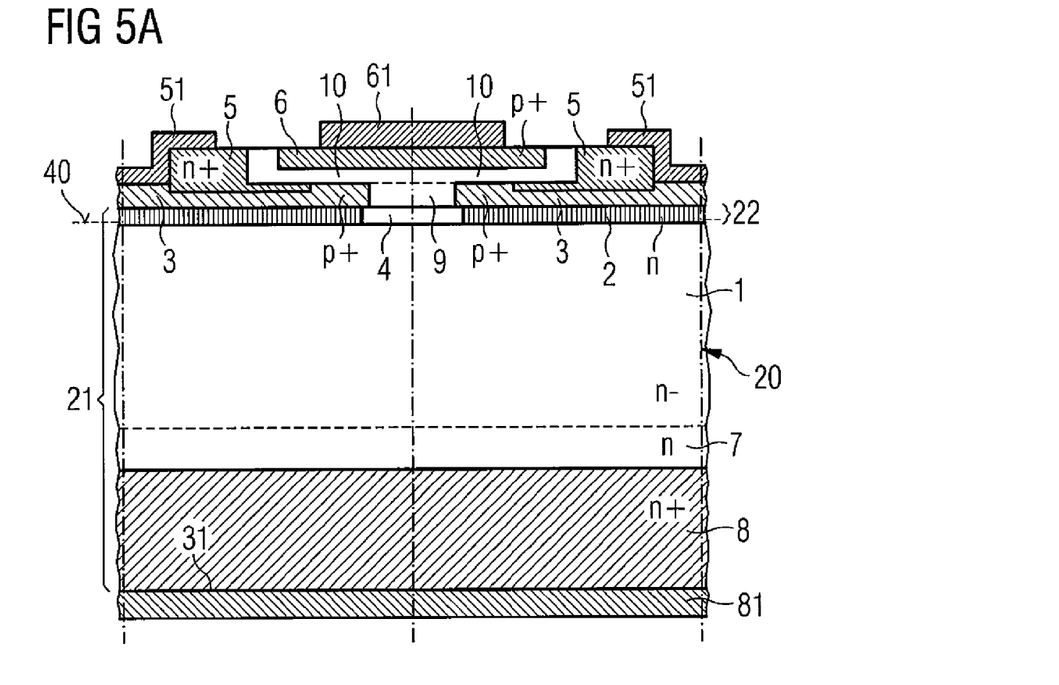
FIG. 5A illustrates a vertical cross-section of a Power JFET.

With reference to FIG. 5A, further embodiments will be described. The structure of the embodiment illustrated in FIG. 5A can be based on any of the above described embodiments including the advantages mentioned. Similar to the above described embodiments, FIG. 5A illustrates a semiconductor body 20 which includes a drift region 21. The drift region 21 includes the drift portion 1 of the first conductivity type and the structured current spread region or layer 22 which is arranged in the first plane 40 on the drift portion 1. The structured current spread region or layer 22 includes, in a cross-section perpendicular to the first plane 40, at least two current spread portions 2 of the first conductivity type which have a higher doping concentration than the drift portion 1, and at least one first portion 4 of the first conductivity type which is arranged between the two current spread portions 2 and includes a lower doping concentration than the current spread portions 2. The semiconductor body 20 further includes, in the cross-section perpendicular to the first plane 40, at least two body regions 3 which are arranged on the current spread portions 2 on a side opposite to the drift portion 1, and at least two source regions 5 of the second conductivity type. The source regions 5 are arranged on the body regions 3 which are spaced apart by at least one spacer portion 9 of the first conductivity type which is arranged on the first portion 4 of the structured current spread layer 22.

A front electrode 51 can be arranged on the first surface 30 of the semiconductor body 20 and in contact with the source region 5. Typically, a pn-junction between the body region 3 and the adjoining source region 5 is formed. To avoid biasing this pn-junction an electrical contact between the front electrode 51 and the body region 3 can additionally be provided. Further, several or a plurality of body regions 3 and/or source regions 5 can be contacted to one front electrode 51.

For exemplification, FIG. 5 contains symbols corresponding to typical doping relations. In this case n and p refer to n-doping and p-doping, respectively. It will be appreciated by those skilled in the art that the doping can be reversed. Doping concentrations that are higher and lower than certain concentrations are indicated by the superscripts "+" and "–", respectively.

Additionally, a drain region 8 of the first conductivity type can be arranged below the drift portion 1 of the drift region 21. The drain region 8 has usually a comparatively high doping concentration $n^+$ typically ranging from about $1*10^{18}/cm^3$ to about $1*10^{20}/cm^3$ and can adjoin the drift portion 1 of the drift region 21. Further, a field stop portion 7 of the first conductivity type can be arranged between the drift portion 1 and drain region 8. The field stop portion 7 has a doping concentration n, that is lower then the doping concentration $n^+$ of the drain region 8 but higher than the doping concentration $n^-$ of the drift portion 1.

In one or more embodiments the drain region 8 is contacted to a back metallisation or back electrode 81. The back electrode 81 is typically formed on a second surface 31 opposite to the first surface 30. Further, several or a plurality of cells can be contacted to one back electrode. This is especially useful for power semiconductor devices.

The semiconductor body 20 can further include a fourth semiconductor region 10 of the first conductivity type which is arranged on and in contact with the body regions 3, thereby forming pn-junctions. The fourth semiconductor region 10 typically forms a channel region 10. In the following description, the term "channel region" is used and includes the term "fourth semiconductor region". This should, however, not be considered as a limitation.

Typically, the source region 5 is also in contact with the channel region 10 for providing a low-resistance contact of the channel region 10. In other words, the source region 5 adjoins a respective channel region 10.

In one or more embodiments the doping concentration of the channel region 10 is higher than the doping concentration $n^-$ of the drift portion 1. The doping concentration of the channel region 10 defines the pinch-off voltage and should therefore appropriately adjusted. Further, the channel region 10 can be in contact with the spacer region 9 which has typically also a doping concentration that is substantially equal to the doping concentration $n^-$ of the drift portion 1. Thus a unipolar current path between the drift region 1 and the source regions 5 is provided by the first portion 4, the spacer portion 9, and the channel region 9. Since the spacer portions 9 are higher doped in regions where two adjacent body regions 9 run substantially parallel to each other (see FIGS. 1 and 2B) those regions significantly contribute to the current path in the on-state due to their reduced resistance in comparison with low doped spacer portions 9 (FIG. 2A). The channel region 10 can be in contact with several body regions 3 and source regions 5. Thereby, the respective source regions 5 of several or a plurality of cells of e.g., a power semiconductor device can be connected by a unipolar current path with the drift portion 1.

Typically, the lateral extension of the channel region 10 is larger then its vertical extension. In other words, the channel region 10 substantially extends along a lateral plane. Further, the channel region 10 can at least partially extend into the spacer portion 9 or partially be arranged on and be in contact with the spacer portion 9. The vertical thickness of channel region 10 ranges typically from about 500 nm to about 3 μm.

In one or more embodiments at least a sixth semiconductor region 6 of the second conductivity type is arranged on and in contact with the channel region 10, thereby forming a pn-junction. Typically, the sixth semiconductor region 6 forms a gate region. In the following description, the term "gate region" is used and includes the term "sixth semiconductor region". This should, however, not be considered as a limitation. The gate region 6 is typically arranged on the channel region 10, such that the channel region 10 is arranged between the body regions 3 and the gate region 6. The doping concentration of the gate region 6 ($p^+$) is typically higher than the doping concentration of the body region 3.

The semiconductor body 20 can further include a gate electrode 61 in contact with the gate region 6. Further, several or a plurality of gate regions 6 can be contacted to a common gate electrode 61.

The embodiment illustrated in FIG. 5A refers to a JFET, more particular to a vertical JFET. If the dopants are distributed as indicated in FIG. 5A the illustrated embodiment refers to an n-channel JFET. If a voltage difference between the source electrode 51 and the back electrode 81 is applied, an electric current between the two electrodes can flow through the n-dopant type areas of FIG. 5A (on-state). The source electrode 51 can be at ground while a positive voltage, for instance of about few V or higher, is applied to the back electrode 81. The device has a comparatively low resistance because the current is laterally spread wider in the drift portion 1 by the current spread portion 2. The current flow or the resistance of the device can now be controlled by a typically negative gate voltage of the gate electrode 61, which can be typically in the range from about –10V to about –30V. This is because the extension of the depletion region around the pn-junctions can be controlled by the gate voltage. Since the doping concentration of the p-dopant type regions p+(body regions 3, gate regions 6) is typically higher then the doping concentration of the channel region n, the depletion region has a larger extension in the channel region 10. Higher negative gate voltages correspond to larger depletion regions and hence to higher resistances. At a high negative threshold gate voltage the device is switched off (off-state). Note, that in case of a p-channel JFET, in which the doping is reversed, a high positive gate-source voltage is required to switch off the device.

In one or more embodiments a plurality of cells is connected to a common front electrode 51 and a common back electrode 81. In other words, the semiconductor device is a power JFET including the drift region 21 which includes the drift portion 1 and the structured current spread layer 22. The structured current spread layer 22 includes regions of different doping concentrations: the current spread portion 2 having a doping concentration which is higher then the doping concentration of the drift portion 1 and of the first portions 4. Further, the power JFET can be formed as vertical semiconductor device.

In the off-state, high electric field strength can occur at or close to certain pn-junctions of the semiconductor device. At sufficiently high voltages an electrical breakdown e.g., by an avalanche process can occur. This limits the switching ability of the semiconductor device. As can be seen in the FIGS. 6 to 9, the highest electric fields usually occur at or close to the edges and corners of pn-junctions and depend on their spatial curvature. In particular, close to the pn-junction between body region 3 and the drift portion 1 high electric field strength can be expected. The absolute value of the field strength at given voltage drop depends further on the distances e.g., between neighbouring body regions 3 and doping concentrations. FIGS. 6 to 9 illustrate two-dimensional simulations of semiconductor devices, which do not include a current spread portion 2 or current spread layer 2. Besides, the structure of the devices used for the simulations is substantially similar to the structure illustrated in FIGS. 5A and 5B. The different structure of the source region 5 and the front electrode 51 in FIGS. 6 and 7 does not influence the simulation.

Figure 5B:
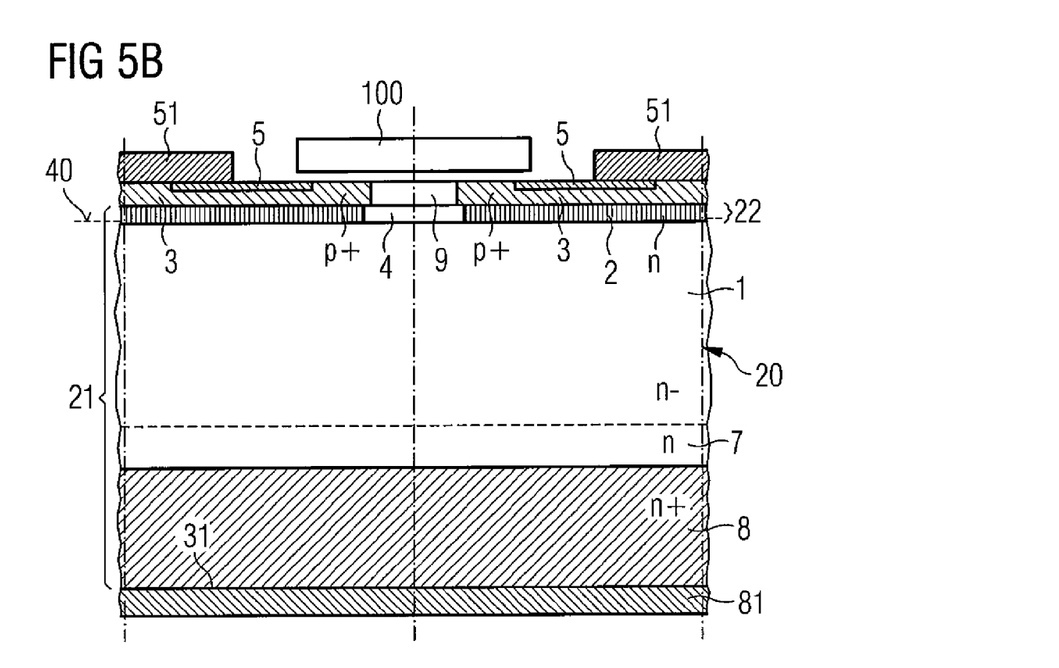
FIG. 5B illustrates a vertical cross-section of a Power-MOSFET.
Figure 6:
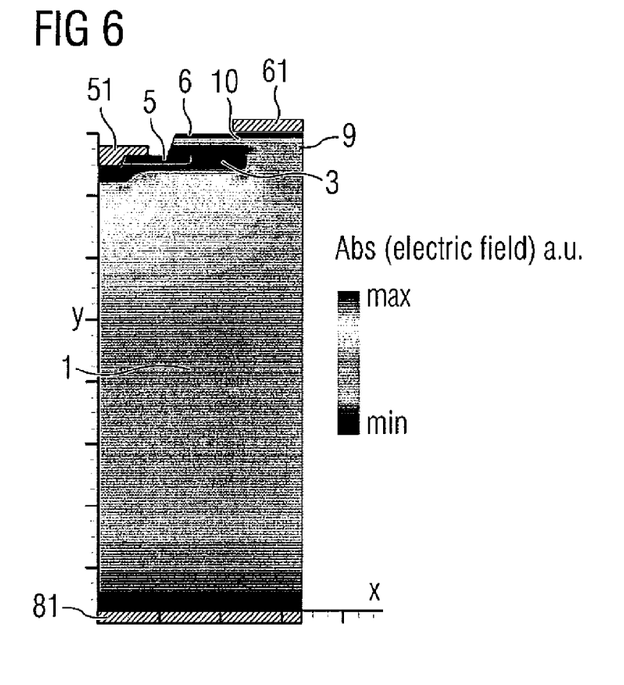
FIG. 6 illustrates a simulated electric field distribution in a vertical cross-section of a power JFET.
Figure 7:
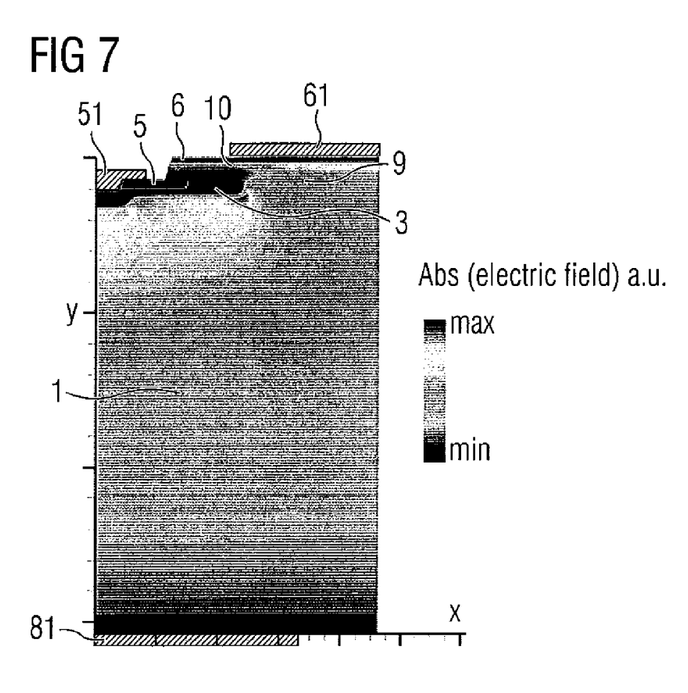
FIG. 7 illustrates a simulated electric field distribution in a vertical cross-section of another power JFET.
Figure 8:
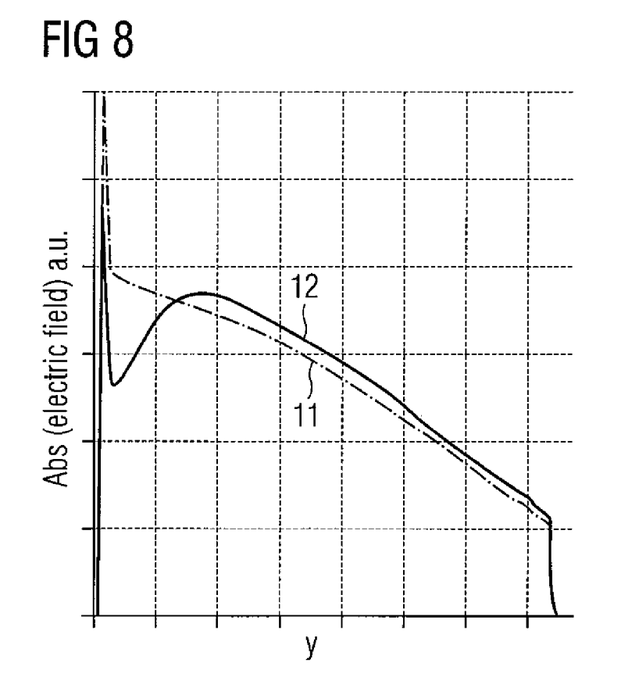
FIG. 8 illustrates simulated electric field curves below the gate electrode of the power JFETs of FIGS. 6 and 7.

FIGS. 6 and 7 correspond to vertical cross-sections through semiconductor devices. Since FIGS. 6 and 7 are two-dimensional simulation, the structures illustrated would mainly correspond to a stripe layout but is also a sufficiently good approximation of the electrical field distribution of comparable layouts. Compared to FIGS. 5A and 5B only the electric field distribution of the left half of the device is presented. In the off-state the highest absolute electric field strength is observed, in the vertical cross-section, below the corner of the body region 3 facing to a not illustrated neighbouring right body region 3. The lateral distance of two neighbouring body regions 3 is about 2.4 times higher in FIG. 7 compared to FIG. 6. This yields an about 7% higher maximum electric field strength in the device. Therefore, the breakdown voltage of the device decreases with increasing lateral distance between two body regions 3. Consequently, if several body regions 3 are e.g., arranged on a lattice such as the square lattice illustrated in FIG. 1, the breakdown is expected to occur close to the body regions 3 and in areas between more than two neighbouring, i.e. four neighbouring body regions 3 in case of the square lattice. This is because the distance b (see FIG. 1) between diagonally neighbouring body regions 3 is about 1.4 times higher (for square shaped body regions 3 orientated in parallel to the lattice as in FIG. 1) then between neighbouring body regions 3 in a lattice direction.

Taking into account typical corner rounding of the body regions 3, the distance b between diagonally neighbouring body regions 3 is about 2.5 times higher compared to the distance a in a lattice direction (FIG. 1). If a current spread region 2 having a larger conductivity or doping concentration is provided additionally on the drift region 1, the electric field distribution close to body regions 3 of such a device is more homogeneous if first portions 4 of a lower conductivity are arranged close to the critical regions. This is because the electric field strength will be lower in depleted regions of lower conductivity.

In addition, the electric field strength in the off-state is higher below the pn-junction of the gate region 6 if the spacing between the neighbouring body regions 3 is larger. This is illustrated quantitatively in FIG. 8. The curves 11 and 12 correspond to the electric field strength at the right border of FIG. 7 and 8, respectively. The coordinate y gives the distance from the top surface (first surface 30) in relative units. Clearly, close to the gate region 6 the electric field is higher in case of the larger spaced body regions 3 of FIG. 7 (curve 11) than for less spaced body regions 3 (curve 12) of FIG. 6. The electrical field strength would be even more pronounced in case of a continuous current spread region.

Figure 9:
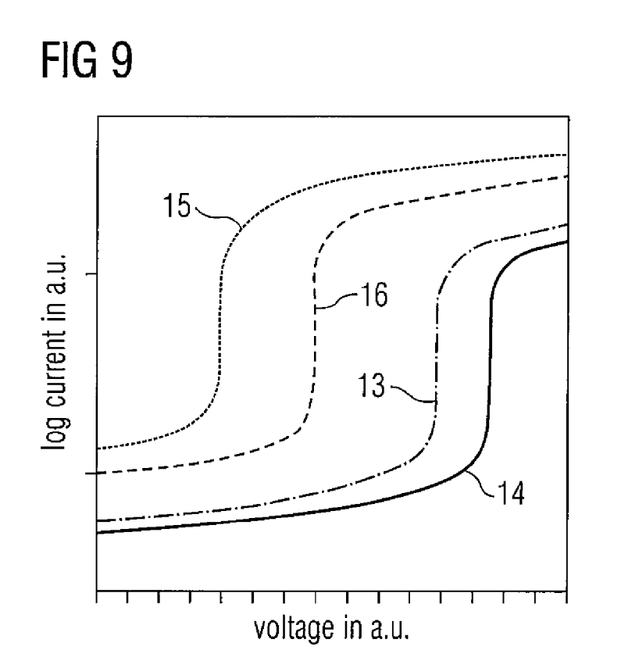
FIG. 9 illustrates simulated current-voltage characteristics of the power JFETs illustrated in FIGS. 6 and 7.

Further, the electric field distribution close to the body regions 3 is influenced by the curvature of the pn-junctions. This is explained qualitatively in FIG. 9 showing current-voltage characteristics of JFETs in the off-state. In doing so, the full lines 13 and 14 correspond to semiconductor devices as illustrated in FIG. 7 and 6, respectively, having straight pn-junctions between body regions 3 and spacer portions 9, wherein line 14 illustrates the characteristic of a device having a larger lateral spacing between adjacent body regions. At moderate voltages, only comparatively small currents flow. Note that the current is plotted on a logarithmic scale. Above a certain threshold the current increases sharply with voltage, i.e. an avalanche breakdown occurs. As to be expected from the electric field distributions of FIGS. 6 and 7, the breakdown voltage is lower for higher distances between neighbouring body regions 3 (FIG. 7).

The dashed lines 15 and 16 relate to similar simulations in cylinder symmetry. In other words, the body regions 3 are formed as thin cylinders and having thus, in projection on the first plane 40, a round or curved contour. The distance between neighbouring body regions 3 is equal for the two curves 13 and 15 on the one hand and for the two curves 14 and 16 on the other hand. The full lines 13 and 14 correspond to a semiconductor device with body regions 3 running parallel to each other without any lateral curvature, e.g., arranged on a one-dimensional lattice. As can be appreciated from comparing the dashed and full lines, any deviation from the straight shape of the body regions 3 like a curvature will decrease the breakdown voltage. The decrease of breakdown voltage strongly depends on curvature and doping. It can amount up to a several 100 V in case of power semiconductor devices.

To improve the overall device performance, the critical regions of the body regions 3 near the corners or where the shape of the body region 3 is laterally curved can be defused in the off-state by a structured current spread layer 22. In other words, the current spread layer 22 is not formed in areas where the body regions have a curved outer boundary. For this purpose first portion 4 having a lower doping concentration can be arranged on the drift portion 1 and close to the critical regions of high field strength.

It should be noted, that a higher doping concentration of the drift region 21 close to the body regions typically increases the field load in the off-state. Therefore, arranging a homogeneous current spread layer, which has a higher doping concentration than the drift portion 1, between the drift portion 1 and the body regions 3 results typically in a decrease of the breakdown voltage. Using a structured current spread region or layer 22, the increased field load is at least partially compensated in critical regions of high electric field strength by the first portions 4. At the same time the on-state resistance can be reduced remarkably. Typically, the on-state resistance is reduced by up to a few 10 percent. Depending on the task of the device, the trade-off between breakdown voltage and on-state resistance can be adjusted e.g., by the doping concentration of the current spread portion 2, the vertical thickness of the structured current spread region or layer 22 and the position and lateral shape, i.e. the outline in a plan view, of the first portions 4.

The concept of a structured or composite current spread layer 2 can also be applied to other semiconductor devices such as IGBT's (insulated gate bipolar transistor) or MOSFET's, especially vertical power MOSFET's. In the latter case the structured current spread layer 2 can e.g., be used to reduce the resistance in forward bias and to protect critical regions close to pn-junctions in reversed bias that may occur during operation of the device.

An example of a MOSFET is illustrated in FIG. 5B. Different to the JFET illustrated in FIG. 5A, no channel region 10 is formed on the body regions 3. In fact, a gate electrode 100 is arranged close to the body regions 3 to cause in inversion channel between the source regions 5 and the spacer portion 9. The current spread region 22 can be structured as described above.

In case of an IGBT, an emitter region 8 of the first conductivity type (typically p+) would be formed instead of the drain region 8 at the second surface 31. Back electrode 81 would than contact emitter region 8.

In a further embodiment a method for producing a semiconductor device is provided. It includes the process of providing a semiconductor body 20 of a first conductivity type which has the first doping concentration. Further, a process of forming a current spread portion 2 of the second conductivity type and including the second doping concentration which is higher then the first doping concentration is included. It is carried out such that the current spread portion is arranged in the first plane 40 on a drift portion 1 of the drift region 21, wherein the drift region 21 further includes first portions 4 of the first conductivity type, which have lower doping concentration than the current spread portion 2 and that are partially surrounded by the current spread portion 2.

In one or more embodiments the method for producing a semiconductor device includes a process of forming source regions 5 of the first conductivity type on each of the body regions 3.

Forming of the different semiconductor regions and portions can include deposing a semiconductor material such as the production of epitaxial layers on the semiconductor body 20 or substrate. Ion implantation can be used to form the different semiconductor regions and portions.

Typically, the structured current spread region 22 is formed after the formation the body and source regions.

In one or more embodiments the body regions 3 and the source regions 5 are formed in a self adjusting way by isotropic wet chemical etching of a first implantation mask. Typically, an oxide mask is used. Openings are formed in the first implantation mask to define the location of the source regions. After implanting an appropriate dopant in the semiconductor body to form the source regions 5, the first implantation mask is isotropically etched to widen the mask openings. The etched first implantation mask can then be used for implanting the body regions 3. In doing so, the body region 3 and source regions 5 are self adjusted to each other. In case of a mask with square openings for implantation of the source regions 5, a mask including rounded squares is produced by the etching process. This can results in a semiconductor device as illustrated in FIG. 1.

The first mask can further be used to form alignment marks in the first semiconductor which are used for aligning subsequent lithographic masks.

The structured current spread region 22 can be formed by one ion implantation process using a second implantation mask, which covers the regions of the first portions 4. Typically, a resist mask is used as second implantation mask. In this way the drift portion 1 and the first portions 4 are formed such that they have substantially the same doping concentration. The implantation is performed such that, in a vertical direction, the implantation region extends from below the body regions (including the current spread region) up to the surface of the semiconductor body. By doing so, the spacer portions 9 between parallel running body regions are also doped. Although dopant may be implanted into the body regions too, this does not significantly effect the doping concentration of the body regions since they have a higher doping concentration than the doping concentration of the current spread region.

The written description above uses specific embodiments to disclose the invention, including the best mode, and also to enable any person skilled in the art to make and use the invention. While the invention has been described in terms of various specific embodiments, those skilled in the art will recognise that the invention can be practiced with modification within the spirit and scope of the claims. Especially, mutually non-exclusive features of the embodiments described above may be combined with each other. The patentable scope is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
  a drift portion of a first conductivity type comprising a first doping concentration;
  spaced apart body regions of a second conductivity type arranged on the drift portion;
  a current spread portion of the first conductivity type arranged in a first plane between the drift portion and the body regions, the current spread portion comprising a second doping concentration which is higher than the first doping concentration; and
  first portions of the first conductivity type, which are arranged in the first plane on the drift portion and at least partially surrounded by the current spread portion, the first portions comprising a third doping concentration which is lower than the second doping concentration.

2. The semiconductor device of claim 1, wherein, in a cross-section perpendicular to the first plane, spacer portions of the first conductivity type are arranged between adjacent body regions.

3. The semiconductor device of claim 2, wherein the spacer portions are arranged on, and in contact with, the first portions.

4. The semiconductor device of claim 1, wherein the first portions are arranged at least in an area where, in a projection on the first plane, the contour of the body regions is at least partially curved.

5. The semiconductor device of claim 1, wherein, in a projection on the first plane, a respective first portion is arranged at least between adjacent body regions in an area defined by at least two or three adjacent body regions.

6. The semiconductor device of claim 1, wherein, in a projection on the first plane, a respective first portion is arranged at least between adjacent body regions in an area defined by at least four adjacent body regions.

7. The semiconductor device of claim 1, wherein the body regions are lattice-like arranged.

8. The semiconductor device of claim 1, comprising wherein a source region of the first conductivity type is arranged on each of the body regions; and
wherein the drift portion is arranged on a drain region of the first conductivity type.

9. The semiconductor device of claim 1, further comprising:
a channel region of the first conductivity type arranged on the body regions; and
at least a gate region of the second conductivity type arranged on the channel region, such that the channel region is arranged between the body regions and the gate region.

10. A semiconductor device, including a semiconductor body comprising:
a first semiconductor region of a first conductivity type comprising a first doping concentration;
a second semiconductor region of the first conductivity type arranged on the first semiconductor region in a first plane, the second semiconductor region comprising:
at least a first portion comprising a third doping concentration; and
at least a second portion comprising a second doping concentration which is higher than the first and the third doping concentrations; and
at least a third semiconductor region of a second conductivity type arranged on the second portion of the second semiconductor region;
wherein the first portion is arranged at least in an area where, in a projection on the first plane, the contour of the third semiconductor region is curved.

11. The semiconductor device of claim 10, wherein the third doping concentration is substantially equal to the first doping concentration.

12. The semiconductor device of claim 10, comprising a plurality of third semiconductor regions which are lattice-like arranged.

13. The semiconductor device of claim 12, wherein the first portions are arranged in a lattice-like arrangement which is displaced with respect to the arrangement of the third semiconductor regions.

14. The semiconductor device of claim 12, wherein, in a projection on the first plane, a respective first portion is centrally arranged between adjacent third semiconductor regions.

15. The semiconductor device of claim 12, wherein, in a projection on the first plane, a respective first portion adjoins the adjacent third semiconductor regions.

16. A semiconductor device, comprising:
a first semiconductor region of a first conductivity type comprising a first doping concentration;
a second semiconductor region of the first conductivity type arranged on the first semiconductor region in a first plane, the second semiconductor region comprising, in a cross-section perpendicular to the first plane,
at least a first portion comprising a third doping concentrations; and
at least two spaced apart second portions comprising a second doping concentration which is higher than the first and the third doping concentration, the first portion being arranged between the second portions; and
at least two spaced apart third semiconductor regions of a second conductivity type arranged on the second portion of the second semiconductor region;
wherein, in the cross-section, a respective third semiconductor region is arranged on a respective second portion.

17. The semiconductor device of claim 16, further comprising:
spacer portions of the first conductivity type, which are, in the cross-section, arranged between adjacent third semiconductor regions; and
fourth semiconductor regions of the first conductivity type arranged on respective third semiconductor regions and in contact with respective spacer portions.

18. The semiconductor device of claim 17, further comprising:
fifth semiconductor regions of the first conductivity type comprising a higher doping concentration than the fourth semiconductor region, wherein each of the fifth semiconductor regions is arranged on a respective third semiconductor region and adjoins a respective fourth semiconductor region; and
wherein each of the third semiconductor regions encloses, in a projection on the first plane, the respective fifth semiconductor region.

19. The semiconductor device of claim 17 further comprising, in the cross-section, sixth semiconductor regions of the second conductivity type arranged on and in contact with respective fourth semiconductor regions.

20. A semiconductor device, wherein the semiconductor device is a power JFET or a power MOSFET comprising:
a drift portion; and
a structured current spread layer comprising regions of different doping concentrations.

* * * * *